US012587154B2

(12) United States Patent
Tripurari et al.

(10) Patent No.: US 12,587,154 B2
(45) Date of Patent: Mar. 24, 2026

(54) POP-CLICK-NOISE (PCN) REDUCTION IN AUDIO DRIVER

(71) Applicant: TEXAS INSTRUMENTS INCORPORATED, Dallas, TX (US)

(72) Inventors: Laxmi Vivek Tripurari, Bangalore (IN); Anand Subramanian, Bangalore (IN); Tanmay Halder, Bangalore (IN); Anand Kannan, Bangalore (IN); Priyanshu Pandey, New Delhi (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 99 days.

(21) Appl. No.: 18/590,280

(22) Filed: Feb. 28, 2024

(65) Prior Publication Data

US 2025/0030391 A1 Jan. 23, 2025

(30) Foreign Application Priority Data

Jul. 20, 2023 (IN) .............................. 202341048864

(51) Int. Cl.
H03G 3/34 (2006.01)
H03F 3/183 (2006.01)
H04R 3/00 (2006.01)

(52) U.S. Cl.
CPC .............. *H03G 3/34* (2013.01); *H03F 3/183* (2013.01); *H04R 3/00* (2013.01); *H03F 2200/03* (2013.01)

(58) Field of Classification Search
CPC ....... H03G 3/34; H03F 3/183; H03F 2200/03; H04R 3/00
See application file for complete search history.

(56) References Cited

U.S. PATENT DOCUMENTS

| | | | | |
|---|---|---|---|---|
| 2006/0066363 A1* | 3/2006 | Ho | ......................... | H03F 1/0261 |
| | | | | 327/108 |
| 2009/0208032 A1* | 8/2009 | Wu | ......................... | H03F 1/305 |
| | | | | 381/94.5 |
| 2010/0004936 A1* | 1/2010 | Chao | ........................ | H03F 1/305 |
| | | | | 704/E21.001 |
| 2011/0274290 A1* | 11/2011 | Holzmann | .............. | H03F 1/305 |
| | | | | 381/94.1 |
| 2012/0183155 A1* | 7/2012 | Huang | ................ | H03F 3/45475 |
| | | | | 381/94.5 |
| 2023/0336136 A1* | 10/2023 | Stilgenbauer | ......... | H03F 3/2175 |

* cited by examiner

*Primary Examiner* — David L Ton
(74) *Attorney, Agent, or Firm* — Xianghui Huang; Frank D. Cimino

(57) ABSTRACT

In some examples, a circuit includes a first transistor having a control terminal and first and second terminals. The circuit also includes a first capacitor having first and second terminals, the first terminal of the first capacitor coupled to the control terminal of the first transistor and the second terminal of the first capacitor coupled to the second terminal of the first transistor. The circuit also includes a first switch having first and second terminals, the second terminal of the first switch coupled to the control terminal of the first transistor. The circuit also includes a second capacitor having first and second terminals, the first terminal of the second capacitor coupled to the first terminal of the first transistor and the second terminal of the second capacitor coupled to the first terminal of the first switch.

20 Claims, 9 Drawing Sheets

400

402 — RECEIVE AN INPUT SIGNAL

404 — DETERMINE A GATE CONTROL
SIGNAL BASED ON A DIFFERENCE
BETWEEN THE INPUT SIGNAL
AND A FEEDBACK SIGNAL

406 — PROVIDE Vocm BASED ON
THE GATE CONTROL SIGNAL

408 — PROVIDE AN ANALOG SIGNAL
REPRESENTATIVE OF THE INPUT
SIGNAL AT THE OUTPUT CAPACITOR

700

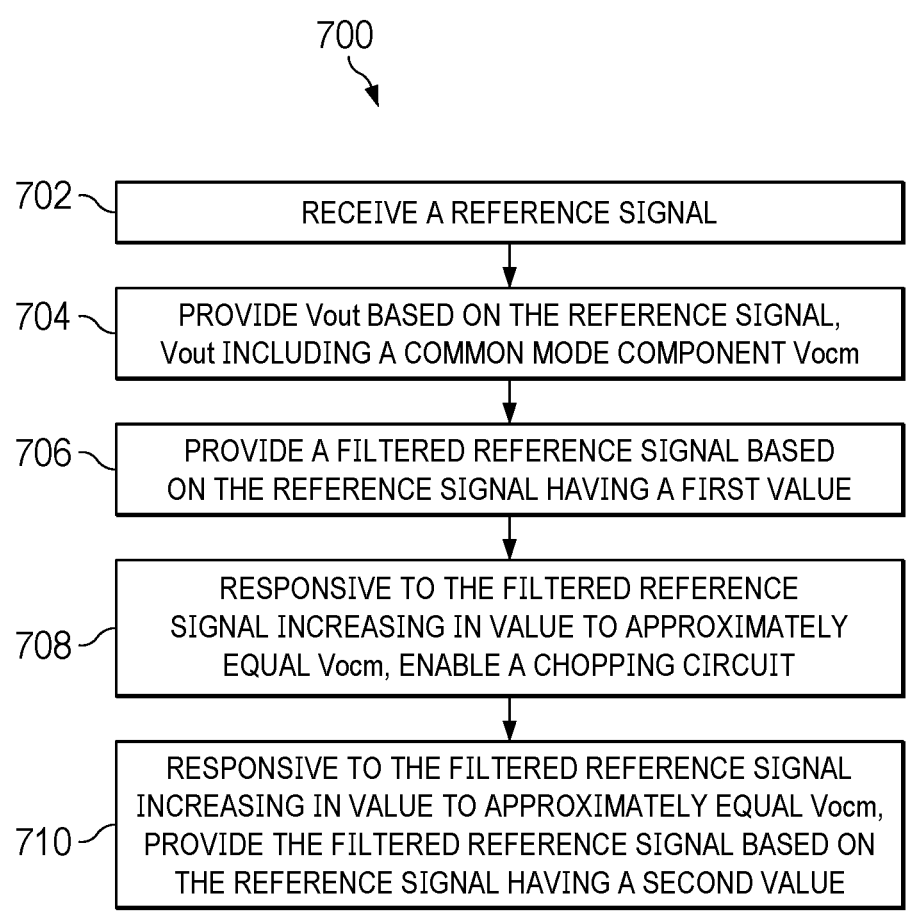

702 — RECEIVE A REFERENCE SIGNAL

704 — PROVIDE Vout BASED ON THE REFERENCE SIGNAL, Vout INCLUDING A COMMON MODE COMPONENT Vocm 706 — PROVIDE A FILTERED REFERENCE SIGNAL BASED ON THE REFERENCE SIGNAL HAVING A FIRST VALUE 708 — RESPONSIVE TO THE FILTERED REFERENCE SIGNAL INCREASING IN VALUE TO APPROXIMATELY EQUAL Vocm, ENABLE A CHOPPING CIRCUIT 710 — RESPONSIVE TO THE FILTERED REFERENCE SIGNAL INCREASING IN VALUE TO APPROXIMATELY EQUAL Vocm, PROVIDE THE FILTERED REFERENCE SIGNAL BASED ON THE REFERENCE SIGNAL HAVING A SECOND VALUE

FIG. 7

POP-CLICK-NOISE (PCN) REDUCTION IN AUDIO DRIVER

CROSS-REFERENCE TO RELATED APPLICATIONS

The present application claims priority to India Provisional Patent Application No. 202341048864, which was filed Jul. 20, 2023, is titled "METHODS TO REDUCE POP-CLICK-NOISE (PCN) IN HIGH PERFORMANCE AUDIO DACS WITH UNIPOLAR HEADPHONE DRIVERS," and is hereby incorporated herein by reference in its entirety.

BACKGROUND

An audio output driver of an audio signal chain provides an analog signal to a device capable of converting the analog signal into sound waves to enable a user to hear the audio signal. Certain circuit conditions such as power up, power down, enabling chopping in the audio driver or audio signal chain may lead to pop-click noise (PCN).

SUMMARY

In some examples, a circuit includes a first transistor having a control terminal and first and second terminals. The circuit also includes a first capacitor having first and second terminals, the first terminal of the first capacitor coupled to the control terminal of the first transistor and the second terminal of the first capacitor coupled to the second terminal of the first transistor. The circuit also includes a first switch having first and second terminals, the second terminal of the first switch coupled to the control terminal of the first transistor. The circuit also includes a second capacitor having first and second terminals, the first terminal of the second capacitor coupled to the first terminal of the first transistor and the second terminal of the second capacitor coupled to the first terminal of the first switch.

In some examples, a circuit includes a first amplifier having an output terminal and first and second input terminals. The circuit also includes a first capacitor having first and second terminals, the first terminal of the first capacitor coupled to the second input terminal of the first amplifier. The circuit also includes a first switch having first and second terminals, the first terminal of the first switch coupled to first terminal of the first capacitor. The circuit also includes a second capacitor having first and second terminals, the first terminal of the second capacitor coupled to the second terminal of the first switch.

In some examples, a system includes a first amplifier. The first amplifier has an output terminal and has first and second input terminals. The first amplifier includes a first transistor having a control terminal and first and second terminals. The first amplifier also includes a first capacitor having first and second terminals, the first terminal of the first capacitor coupled to the control terminal of the first transistor and the second terminal of the first capacitor coupled to the second terminal of the first transistor. The first amplifier also includes a first switch having first and second terminals, the second terminal of the first switch coupled to the control terminal of the first transistor. The first amplifier also includes a second capacitor having first and second terminals, the first terminal of the second capacitor coupled to the first terminal of the first transistor and the second terminal of the second capacitor coupled to the first terminal of the first switch. The system also includes a second amplifier having an output terminal and first and second input terminals. The system also includes a third capacitor having first and second terminals, the first terminal of the third capacitor coupled to the second input terminal of the second amplifier. The system also includes a second switch having first and second terminals, the first terminal of the second switch coupled to first terminal of the third capacitor. The system also includes a fourth capacitor having first and second terminals, the first terminal of the fourth capacitor coupled to the second terminal of the second switch. The system also includes a first resistor having first and second terminals, the first terminal of the first resistor coupled to the first input terminal of the second amplifier, and the second terminal of the first resistor coupled to the first input terminal of the first amplifier. The system also includes a second resistor having first and second terminals, the first terminal of the second resistor coupled to the first input terminal of the second amplifier, and the second terminal of the second resistor coupled to the second input terminal of the first amplifier.

BRIEF DESCRIPTION OF THE DRAWINGS

FIG. 7 is a flowchart of an example method.

DETAILED DESCRIPTION

Figure 1:
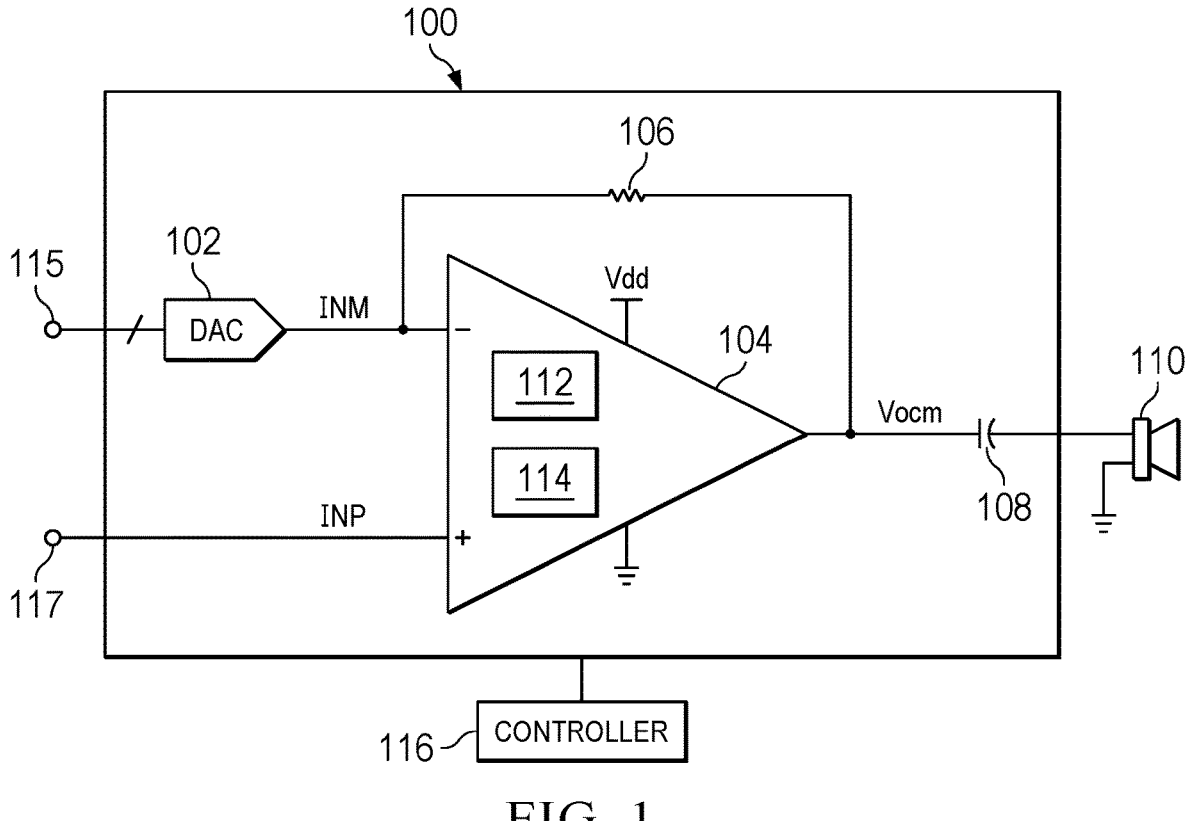
FIG. 1 is a block diagram of an example audio driver.

As described above, an audio driver provides an analog signal to a device capable of converting an analog signal into sound waves to enable a user to hear the audio signal. Certain circuit conditions in the audio driver may lead to pop-click noise (PCN). For example, by rapidly changing a current flowing into an output, or series decoupling capacitor of the driver, PCN may be heard in the resulting sound waves. Similarly, enabling chopping may lead to voltage ripple which in turn may cause a step change in an output voltage of the audio driver may cause additional PCN. Such PCN may lead to an undesirable or unpleasant user experience, and may be unsuitable for audio drivers designated for high performance application environments.

Examples of this disclosure mitigate the occurrence of PCN in sound waves resulting from an output signal of an audio driver. In a first example, a filter is coupled across an output transistor of the driver. In some examples, the filter is implemented as a capacitor coupled between a gate and a drain of the transistor. In this manner, the capacitor may be referred to as a Miller capacitor such that the capacitor has a capacitance value subject to Miller multiplication (e.g., an increased capacitance value resulting from the Miller multiplication). This may enable the capacitor to have a smaller area, while having an approximately equivalent effective capacitance, than another capacitor (or filter) not coupled to the output transistor in a manner so as to be subject to Miller multiplication. In some examples, the capacitor is a switched capacitor such that the filter is a switched Miller capacitor filter. In an example, the filter slows or decreases a rate of change (e.g., slew rate) of a voltage provided at a control terminal, or gate, of the output transistor. The decreased slew rate of the voltage at the control terminal of the output transistor may correspond to a decrease in a slew rate of a current flowing through the output transistor. By decreasing the slew rate of the current flowing through the output transistor, a rate at which the current flows into an output capacitor is slowed, mitigating the occurrence of PCN resulting from rapid changes in current of the output capacitor.

In a second example, an audio driver may implement chopping to increase dynamic range and reduce total harmonic distortion plus noise, and thereby performance, of the audio driver. However, this chopping may result in increased voltage ripple, causing a step change in voltage in an output signal of the audio driver. For example, the chopping may result in the voltage ripple based on a difference in value between an output common mode voltage of the audio driver and an input common mode voltage of the audio driver. In an example, by controlling the audio driver to prevent the beginning of chopping until the input common mode to approximately equals the output common mode voltage, the chopping may begin without introducing the voltage ripple. The input common mode voltage may subsequently begin to vary from the output common mode voltage in a logarithmic manner. In this way, the voltage ripple in the output voltage of the audio driver may also increase logarithmically, or slowly and in a controlled manner. This slow increase in the voltage ripple may mitigate the voltage ripple creating PCN in the output signal of the audio driver.

FIG. 1 is a block diagram of an example audio system 100. In some examples, the audio system 100 includes a digital-to-analog converter (DAC) 102, an audio driver 104, a resistor 106, a capacitor 108, and an audio device 110. In some examples, the audio driver 104 is a class-AB driver, such as a class-AB headphone driver. In some examples, the audio system 100 includes a slew limiting circuit 112. In other examples, the audio system 100 includes a ripple limiting circuit 114. In yet other examples, the audio system 100 includes both the slew limiting circuit 112 and the ripple limiting circuit 114. In some examples, the audio driver 104 includes one or both of the slew limiting circuit 112 and/or the ripple limiting circuit 114. In an example, the DAC 102 is a delta-sigma DAC, while in other examples the DAC 102 operates according to any suitable methodology and has any suitable architecture therefor. In some examples, the audio device 110 is headphones. In other examples, the audio device 110 is a speaker, a transducer, or any other device capable of converting an analog voltage into sound waves. In at least some examples, the audio device is a ground-centered audio device that is coupled to the audio system 100 through the capacitor 108. In some examples, the audio system 100 also includes a controller 116. In other examples, the controller 116 is implemented external to the audio system 100 and may be coupled to the audio system 100.

In an example, the DAC 102 has an output terminal, and has an input terminal coupled to a digital data input terminal 115 of the audio system 100. The audio driver 104 has a first input terminal, a second input terminal, and an output terminal. The first input terminal, which may be a negative or inverting input terminal and the second input terminal may be a positive or non-inverting input terminal. The first input terminal of the audio driver 104 may be coupled to the first output terminal of the DAC 102, and the second input terminal of the audio driver 104 may be coupled to a common mode reference voltage terminal 117 (e.g., at which output common mode voltage (Vocm) may be received). The resistor 106 has a first terminal coupled to the output terminal of the audio driver 104 and a second terminal coupled to the first input terminal of the audio driver 104. The capacitor 108 has first and second terminals, the first terminal of the capacitor 108 coupled to the output terminal of the audio driver 104. The audio device 110 has first and second terminals, the first terminal of the audio device 110 coupled to the second terminal of the capacitor 108, and the second terminal of the audio device 110 coupled to a ground terminal at which a ground voltage potential is provided.

As described above, a current flow into or out of the capacitor 108 greater than a threshold amount may result in PCN. For example, during startup of the audio system 100, current may flow into the capacitor 108 to establish a common-mode operating voltage of the audio system 100. Similarly, during shutdown of the audio system 100, current may flow out of the capacitor 108. To mitigate the occurrence of PCN, the slew limiting circuit 112 limits a rate of current flow (e.g., a slew rate) of the capacitor 108. For example, the slew limiting circuit 112 may control the audio driver 104 to create a slow turn-on effect for the audio driver 104, limiting the rate at which the audio driver 104 provides current to the capacitor 108. In this way, the slew limiting circuit 112 may mitigate the occurrence of PCN in the audio system 100 resulting from sudden changes in current flowing into or out of the capacitor 108. Similarly, the audio driver 104 may implement chopping, such as to reduce low-frequency noise in an output signal of the audio driver 104. However, this chopping may introduce chopping artifacts into the output signal of the audio driver 104, such as a voltage ripple. This voltage ripple may also result in PCN. To mitigate this occurrence of PCN, the ripple limiting circuit 114 may provide a logarithmically changing reference voltage. The reference voltage may be based, at a first time, on an Vocm of the audio driver 104 and at a second time on an input common mode voltage (Vicm) of the amplifier. For example, Vocm may be filtered to provide the reference voltage such that the reference voltage increases approximately logarithmically in value. Responsive to Vocm approximately equaling Vicm, the ripple limiting circuit 114, or the controller 116, may control the audio driver 104 to begin chopping. Similarly, the ripple limiting circuit 114 may begin basing the reference voltage on Vicm, which may be less than Vocm, such that the reference voltage decreases approximately logarithmically to approximately equal Vicm. In this way, growth of the ripple voltage may be controlled by the ripple limiting circuit 114 to grow approximately logarithmically in value, preventing sudden or large changes that may result in PCN.

In an example, the controller 116 controls at least some operations or functions of the audio system 100. For example, the controller 116 determines and/or provides control signals to control various switches (not shown) of the audio system 100, provides one or more reference voltages to the audio system 100, or the like. In an example, the controller 116 controls switching of a switched capacitor (not shown), such as a switched Miller capacitor filter, implemented as, or in, the slew limiting circuit 112. In another example, the controller 116 controls chopping performed by the audio system 100, controls switching of switches (not shown) of the ripple limiting circuit 114, controls the determining and/or providing of reference voltages to the ripple limiting circuit 114, or the like. Although not shown in FIG. 1, in some examples, the controller 116 has an output terminal coupled to the digital data input terminal 115, such as to provide a digital data signal (e.g., a digital audio signal). Although shown outside the audio system 100, in some examples, the controller 116 may be included in the audio system 100.

Figure 2:
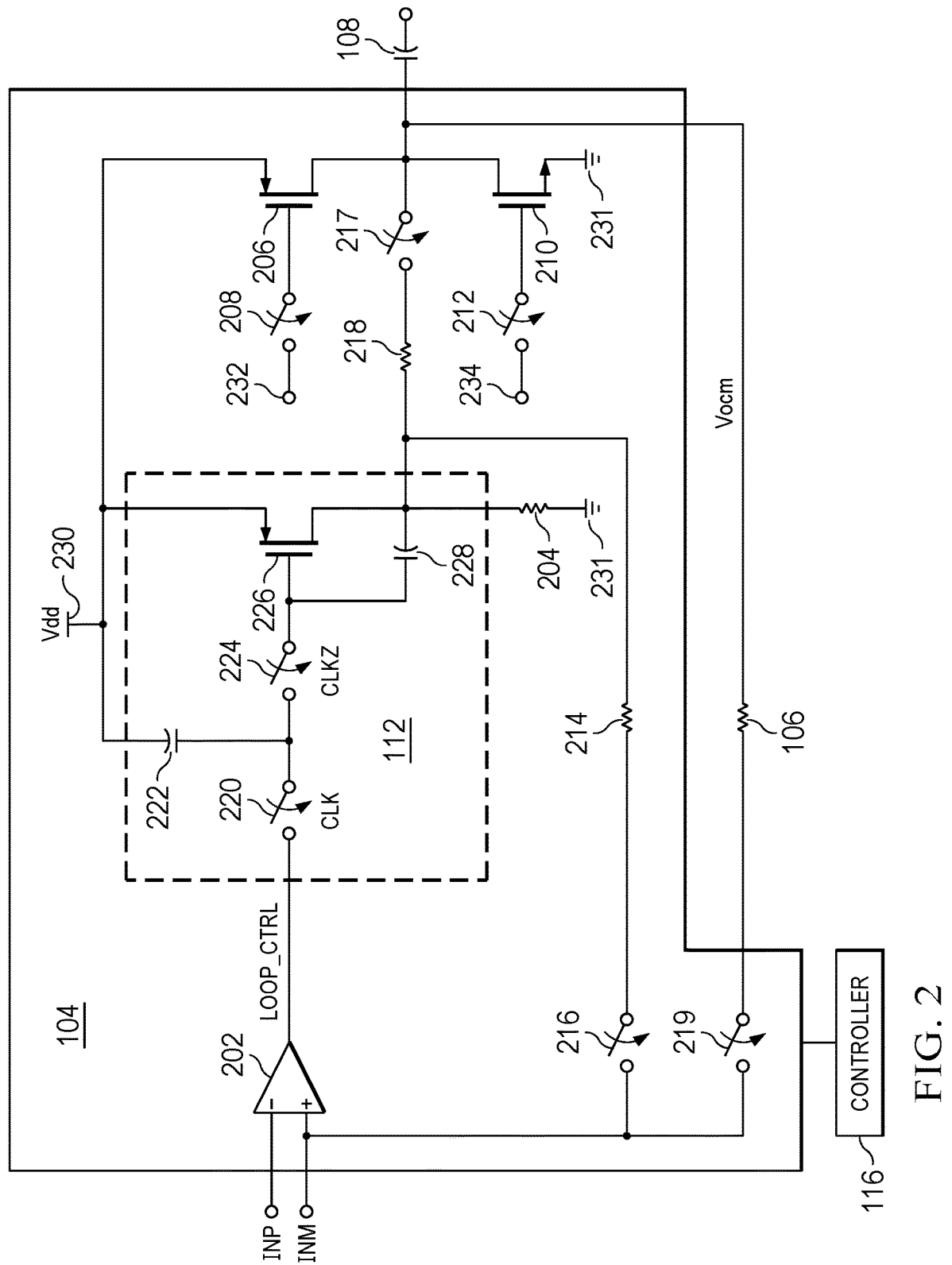
FIG. 2 is a schematic diagram of an example amplifier.

FIG. 2 is a schematic diagram of an example audio driver 104 including the slew limiting circuit 112. In some examples, the audio driver 104 includes a differential amplifier 202, a resistor 204, a transistor 206, a switch 208, a transistor 210, a switch 212, a resistor 214, a switch 216, a switch 217, and a switch 219. In some examples, the audio driver 104 also includes a resistor 218. In other examples, the audio driver 104 couples to the resistor 218, such that the resistor 218 is external to the audio driver 104. Similarly, in some examples, the audio driver 104 includes the resistor 106 and/or the capacitor 108. But in other examples, the audio driver 104 may couple to the resistor 106 and/or the capacitor 108, such that the resistor 106 and/or the capacitor 108 are external to the audio driver 104. In an example, the slew limiting circuit 112 includes a switch 220, a capacitor 222, a switch 224, a transistor 226, and a capacitor 228. In some examples, the transistor 226 is a field effect transistor (FET), such as a p-channel FET.

In an example, the differential amplifier 202 has first and second input terminals, and has an output terminal. The first input terminal may be a negative, or inverting input terminal, and the second input terminal may be a positive, or non-inverting input terminal. The output terminal of the differential amplifier 202 is coupled to a first terminal of the switch 220, which also has a second terminal. The capacitor 222 has a first terminal coupled to a supply voltage terminal 230 at which a voltage supply (Vdd) is provided, and has a second terminal coupled to the second terminal of the switch 220. The switch 224 has a first terminal coupled to the second terminal of the switch 220, and has a second terminal. The transistor 226 has a control terminal coupled to the second terminal of the switch 224, a first terminal coupled to the supply voltage terminal 230, and has a second terminal. The capacitor 228 has a first terminal coupled to the control terminal of the transistor 226, and has a second terminal coupled to the second terminal of the transistor 226. The resistor 204 has a first terminal coupled to the second terminal of the transistor 226, and has a second terminal coupled to a ground terminal 231 at which a ground voltage potential is provided. As shown in FIG. 2, the capacitor 228 may be referred to as a Miller capacitor, which has a capacitance value that undergoes Miller multiplication resulting from a topology of the slew limiting circuit 112. In an example, the transistor 226 is a metal oxide semiconductor field effect transistor (MOSFET) such that its control terminal is a gate terminal and its second terminal is a drain terminal. The capacitor 228, when coupled across the gate and drain terminals of a MOSFET transistor (e.g., the transistor 226) appears larger from an electrical standpoint for small signals because its actual capacitance is multiplied with a transconductance of the MOSFET and an impedance at the drain terminal of the MOSFET, thereby creating a larger electrical, or effective, capacitance. This multiplication is referred to as Miller Multiplication and enables a capacitor having a physical capacitance of a first value and consuming a first silicon area to have an effective, or electrical, capacitance of a second value, greater than the first value, without increasing a physical size of the capacitor to be larger than the first silicon area.

The transistor 206 has a control terminal and first and second terminals. The first terminal of the transistor 206 is coupled to the supply voltage terminal 230. The switch 208 has a first terminal coupled to a terminal 232 and has a second terminal coupled to the control terminal of the transistor 206. In some examples, the terminal 232 and terminal 234 are each coupled to the output terminal of the amplifier 202 such that the transistors 206, 210 may receive LOOP_CTRL as a gate control signal. In other examples, a gate control signal is received at the terminal 232 and the terminal 234, such as from the controller 116, or from any other suitable source. For example, in some implementations, the audio driver 104 may include a second amplifier (not shown) having input terminals coupled in parallel with the input terminals of the amplifier 202, and having an output terminal at which LOOP_CTRL is provided. Although also not shown in FIG. 2, in some examples, a voltage offset is applied to LOOP_CTRL by a voltage source (not shown) coupled between the output terminal of the amplifier 202 and the terminal 234, such as to bias LOOP_CTRL for operation with the transistor 210. The transistor 210 has a control terminal and first and second terminals. The first terminal of the transistor 210 is coupled to the second terminal of the transistor 206, and the second terminal of the transistor 210 is coupled to the ground terminal 231. The switch 212 has a first terminal coupled to a terminal 234 and has a second terminal coupled to the control terminal of the transistor 210.

The resistor 214 has a first terminal coupled to the second terminal of the transistor 226, and has a second terminal. The switch 216 has a first terminal coupled to the second input terminal of the differential amplifier 202, and has a second terminal coupled to the second terminal of the resistor 214. The switch 217 has first and second terminals, the first terminal coupled to the second terminal of the transistor 206. In an example, the resistor 218 has a first terminal coupled to the second terminal of the transistor 226 and a second terminal coupled to the second terminal of the switch 217. In other examples, the resistor 218 may be coupled between the second terminal of the transistor 226 and the second terminal of the switch 217, but externally to the audio driver 104. Similarly, in an example, the capacitor 108 may have a first terminal coupled to the first terminal of the switch 217 and a second terminal coupled, or that may couple, to the audio device 110. In another example, the first terminal of the capacitor 108 may be coupled to the first terminal of the switch 217, but externally to the audio driver 104. The resistor 106 has a first terminal coupled to the first terminal of the switch 217, and has a second terminal, and in at least some examples is external to the audio driver 104. The switch 219 has a first terminal coupled to the second terminal of the resistor 106, and has a second terminal coupled to the second input terminal of the differential amplifier 202.

In an example of operation of the audio driver 104, the differential amplifier 202 receives a differential input signal. For example, the differential amplifier 202 receives a positive component (INP) of the differential input signal at the first input terminal of the differential amplifier 202, and receives a negative component (INM) of the differential input signal at the second input terminal of the differential amplifier 202. The differential input signal may be received from any suitable source, such as the DAC 102, shown in FIG. 1. The differential amplifier 202 determines and provides a signal (LOOP_CTRL) representative of a difference between INM and INP. In an example, the slew limiting circuit 112 determines or controls a slew rate of voltage across the resistor 218. For example, LOOP_CTRL may be gate control signal for controlling the transistor 226, and may be filtered by components of the slew limiting circuit 112. By filtering LOOP_CTRL, such as by a filter formed of the capacitor 222, switched by the switches 220, 224, and the capacitor 228, a rate of change of charge at the control terminal of the transistor 226 (e.g., a slew rate of a signal at the control terminal of the transistor 226) is slowed. By slowing the rate of change of charge at the control terminal of the transistor 226, a rate of change in current flowing through the transistor 226 also changes correspondingly. For example, the rate of change, or slew rate, of charge at the control terminal of the transistor 226 and flowing through the transistor 226 may exhibit behavior over time that approximates a logarithmic response.

In an example, the switches 220, 224 receive CLK and CLKZ control signals, respectively. CLK and CLKZ are non-overlapping, inverse control signals such that at a given time no more than one of the switches 220, 224 is conductive. By switching the switches 220, 224 into conductive and nonconductive states in a repeated manner, the capacitor 222 functions electrically as a resistor having a resistance approximated by 1/Cf, where C is a capacitance of the capacitor 222 and f is a frequency of CLK (or CLKZ). In this way, a resistor-capacitor (RC) filter is formed by the capacitor 222 and the capacitor 228. This RC filter causes a voltage provided, based on LOOP_CTRL, at the control terminal of the transistor 226 to decrease slowly according to a time constant of the RC filter, approximating a logarithmic response. The slow decrease in voltage provided at the control terminal of the transistor 226 corresponding causes a voltage provided at the second terminal of the transistor 226 to increase slowly in value, also approximating a logarithmic response. This slow increase limits a rate at which current flows through the transistor 226, through the resistor 218, and into the capacitor 108 to charge the capacitor 108 to Vocm (e.g., a slew rate of the capacitor 108). By limiting the slew rate of the capacitor 108, voltage transients that may occur at the audio device 110 may be limited. In at least some examples, the voltage transients are limited to a magnitude of no greater than 500 microvolts (V). By limiting the voltage transients in this manner, audio PCN provided by the audio device 110 resulting from the charging (or discharging) of the capacitor 108 may be mitigated, reducing or eliminating the PCN. In addition, by limiting the current through the resistor 218, a resistance of the resistor 218 may be reduced compared to examples of the audio driver 104 which omit the slew limiting circuit 112. This reduction in resistance of the resistor 218 may correspondingly enable a reduction in physical area consumed by the resistor 218, as well as a reduced amount of time for the capacitor 108 to charge to Vocm.

In an example, the switches 208, 212, 216, 217, 219 provide startup sequencing for the audio driver 104. For example, responsive to detecting (such as by the controller 116, or any other suitable component(s)) that an audio device 110 has been coupled to the capacitor 108, the switches 208, 212, 216, and 219 are controlled to be non-conductive, and the switches 216 and 217 are controlled to be conductive. Each of the switches 208, 212, 216, 217, 219 may be implemented in any suitable manner, the scope of which is not limited herein. In some examples, the switches 208, 212, 216, 217, 219 are implemented as transistors. As such, the switches 208, 212, 216, 217, 219 may each have a respective control terminal at which a signal is received, the value of which in relation to a value of a signal at another terminal of the switch determines whether the switch is conductive (e.g., substantially closed or on) or non-conductive (e.g., substantially open or off). In some examples, at least some of the switches 208, 212, 216, 217, 219 receive the control signals from the controller 116. In other examples, at least some of the switches 208, 212, 216, 217, 219 receive the control signals from any other suitable source, the scope of which is not limited herein. Responsive to a voltage of the capacitor 108 increasing to approximately equal Vocm, the switches 208, 212, and 219 are controlled to be conductive, and the switches 216 and

217 are controlled to be non-conductive. In some examples, the determination of the voltage of the capacitor 108 may be made at least in part by the controller 116. In this way, during a startup phase of operation of the driver 104, the slew limiting circuit 112 may control charging of the capacitor 108 to Vocm while preventing such charging from affecting operation of the amplifier 202, transistor 206, or transistor 210. Similarly, following completion of the startup phase of operation, the slew limiting circuit 112 may be electrically decoupled from the capacitor 108, thereby preventing the slew limiting circuit 112 from affecting a quality of audio output provided by the audio driver 104.

In an example, LOOP_CTRL is provided at the terminal 232, and, in some examples, is provided at the terminal 234, while in other examples a level-shifted version of LOOP_CTRL is provided at the terminal 234. Based on control according to a value of LOOP_CTRL, the transistors 206, 210 are conductive, or non-conductive, to provide an output signal (Vout) of the audio driver 104 at the first terminal of the capacitor 108. In this way, the transistors 206, 210 together provide an analog signal at the first terminal of the capacitor 108 that is representative of the differential input signal received by the amplifier 202, creating an audio output signal of the audio driver 104.

Figure 3A:
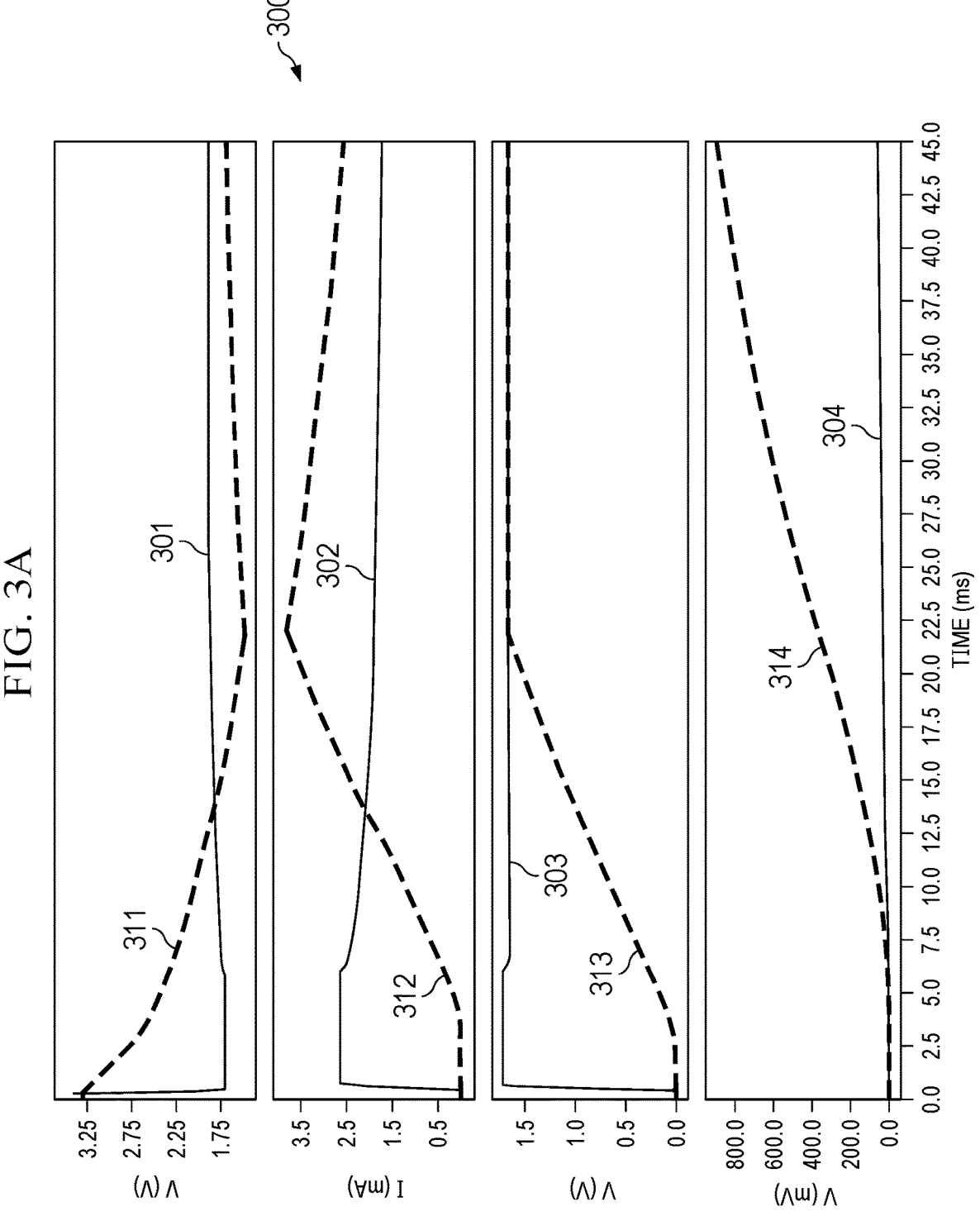
FIGS. 3A and 3B (which may collectively be referred to as FIG. 3) are diagrams of example signal waveforms.
Figure 3B:
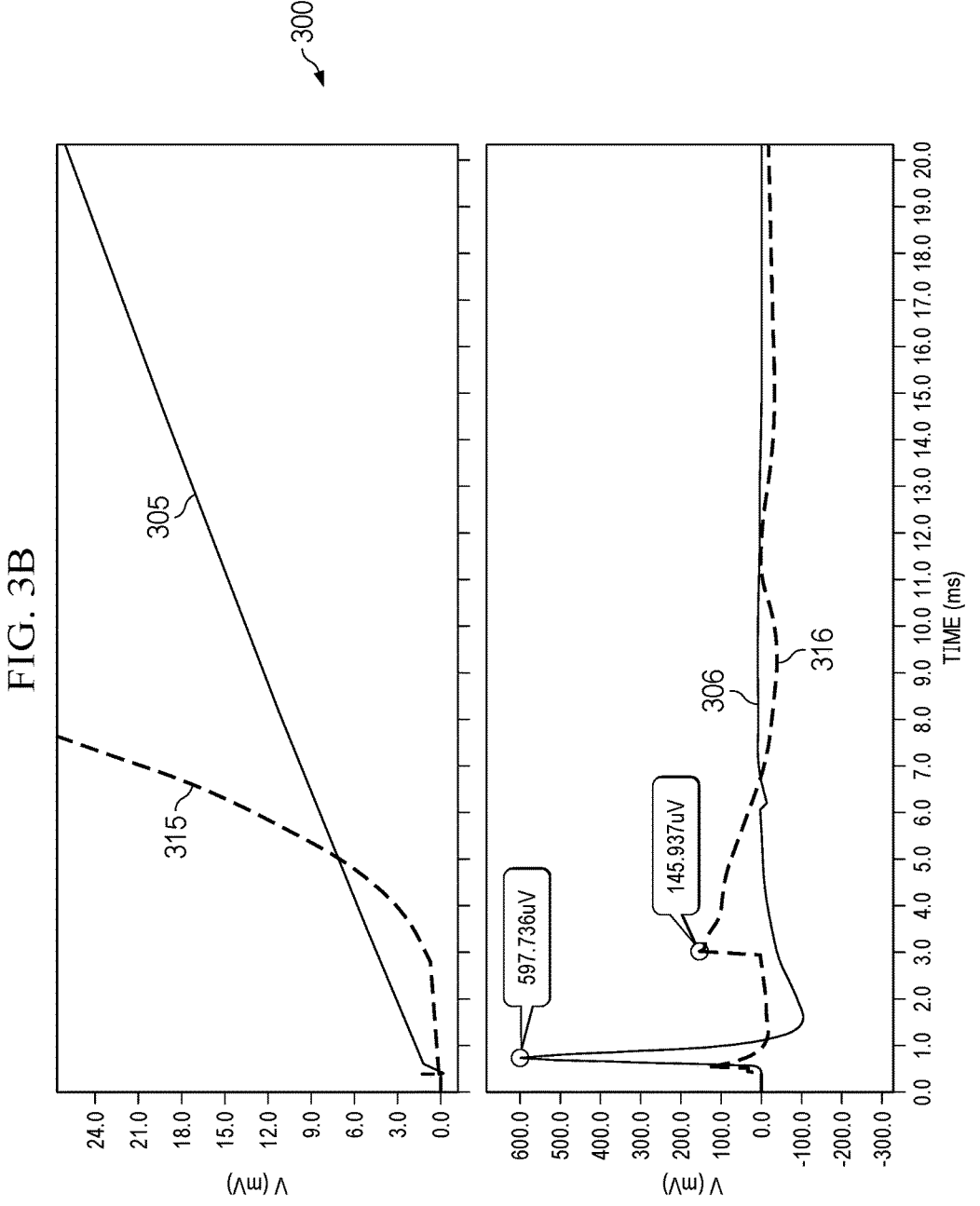

FIG. 3 is a diagram 300 of example signal waveforms. In an example, the diagram 300 is representative of at least some signals that may be present in the audio system 100, such as in, or provided by, the audio driver 104, as described above with respect to FIG. 2. In an example, the diagram 300 includes signals 301, 302, 303, 304, 305, and 306. The signal 301 is representative of a voltage provided at the control terminal of the transistor 226 in the absence of the slew limiting circuit 112, and is shown having a vertical axis representative of voltage in units of volts (V) and a horizontal axis representative of time in units of milliseconds (ms). The signal 302 is representative of a current flowing through the transistor 226 in the absence of the slew limiting circuit 112, and is shown having a vertical axis representative of current in units of milliamps (mA) and the horizontal axis representative of time in ms. The signal 303 is representative of a voltage provided at the second terminal of the transistor 226 in the absence of the slew limiting circuit 112, and is shown having a vertical axis representative of voltage in V and the horizontal axis representative of time in ms. The signal 304 is representative of a voltage provided at the second terminal of the transistor 206 in the absence of the slew limiting circuit 112 (e.g., in which the resistor 218 may have a larger resistance value, and correspondingly larger physical size, than examples that include the slew limiting circuit 112), and is shown having a vertical axis representative of voltage in V and the horizontal axis representative of time in ms. The signal 305 is an enlarged version of the signal 304 representative of a voltage provided at the second terminal of the transistor 206 at a time at which the audio driver 104 is enabled in the absence of the slew limiting circuit 112, and is shown having a vertical axis representative of voltage in units of millivolts (mV) and a horizontal axis representative of time in ms. The signal 306 is representative of a voltage attributable to PCN in the audio device 110 absence of the slew limiting circuit 112, and is shown having a vertical axis representative of voltage in units of microvolts (µV) and the horizontal axis representative of time in ms.

Similarly, the diagram 300 includes also signals 311, 312, 313, 314, 315, and 316. The signal 311 is representative of a voltage provided at the control terminal of the transistor 226 in the presence of the slew limiting circuit 112, and is shown having a vertical axis representative of voltage in V and the horizontal axis representative of time in ms. The signal 312 is representative of a current flowing through the transistor 226 in the presence of the slew limiting circuit 112, and is shown having a vertical axis representative of current in mA and the horizontal axis representative of time in ms. The signal 313 is representative of a voltage provided at the second terminal of the transistor 226 in the presence of the slew limiting circuit 112 (e.g., in which the resistor 218 may have a smaller value, and correspondingly smaller physical size, than examples that lack the slew limiting circuit 112), and is shown having a vertical axis representative of voltage in V and the horizontal axis representative of time in ms. The signal 314 is representative of a voltage provided at the second terminal of the transistor 206 in the presence of the slew limiting circuit 112, and is shown having a vertical axis representative of voltage in V and the horizontal axis representative of time in ms. The signal 315 is an enlarged version of the signal 314 representative of a voltage provided at the second terminal of the transistor 206 in the presence of the slew limiting circuit 112, and is shown having a vertical axis representative of voltage in mV and a horizontal axis representative of time in ms. The signal 316 is representative of a voltage attributable to PCN in the audio device 110 presence of the slew limiting circuit 112, and is shown having a vertical axis representative of voltage in µV and the horizontal axis representative of time in ms.

As shown by comparing the signals 301, 311, the slew limiting circuit 112 filters the voltage provided at the control terminal of the transistor 226, decreasing a rate of change of the voltage. Correspondingly, as shown by comparing the signals 302, 312, and the signals 303, 313, a rate of increase in current flowing through the transistor 226, and therefore a voltage provided at the second terminal of the transistor 226, also decreases. As shown by comparing the signals 305, 316, the signal 305 includes a rapid initial jump in value, followed by an approximately linear response. The rapid initial jump in value may result in PCN, as described above. Through implementation of the slew limiting circuit 112, the signal 315 increases in value more slowly, in an approximately logarithmic manner. This may enable a reduction in resistance, and size of the resistor 218, as described above, and a corresponding reduction in startup time of the audio driver 104. Similarly, as shown by comparing the signals 306, 316, the slew limiting circuit 112 limiting a slew rate of the signal 311, and correspondingly 312, 313, 314, and 315, a magnitude of PCN in the audio device 110 is decreased. As a result, the presence of the slew limiting circuit 112 in the audio driver 104 limits the occurrence of PCN in the audio device 110, increasing a user experience of a user driving the audio device 110 via the audio system 100, while also facilitating a reduction in startup time of the audio driver 104.

Figure 4:
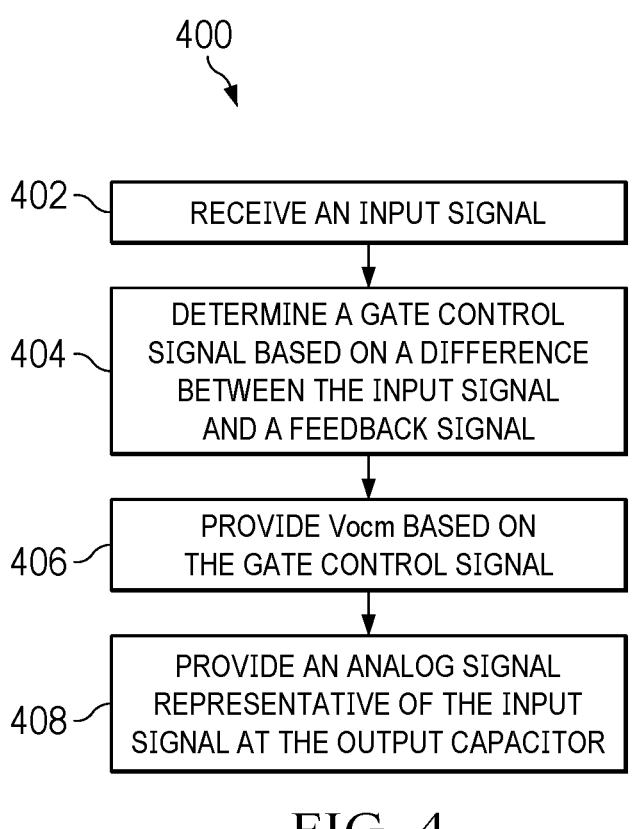
FIG. 4 is a flowchart of an example method.

FIG. 4 is a flowchart of an example method 400. In an example, the method 400 is implemented by the audio system 100, such as at least partially by the audio driver 104 and/or the controller 116. In an example, the method 400 is implemented to limit a slew rate of an output capacitor of the audio system 100, such as the capacitor 108. The method 400 may be implemented to limit the slew rate of the output capacitor to mitigate the occurrence of PCN in an audio device, such as the audio device 110, coupled to the output capacitor and which receives a signal via the output capacitor for conversion from an analog voltage to audible sound waves.

At operation 402, an input signal is received. The input signal may be received, for example, from a DAC. In an example, the input signal is a differential signal representative of audio date for output as an audio signal by the audio driver 104.

At operation 404, a gate control signal is determined based on a difference between the input signal and a feedback signal. In some examples, the feedback signal forms a second component, such as a negative component, of the differential signal. The difference may be determined, in some examples, by a differential amplifier.

At operation 406, Vocm is provided based on the gate control signal. For example, the gate control signal is filtered and provided to the control terminal of a transistor. In some examples, the filtering is performed at least partially by a capacitor coupled in a Miller arrangement. In an example, the capacitor is the capacitor 228, as described above herein, and forms an RC filter with a switched capacitor, such as the capacitor 222, which electrically approximates a resistor. By filtering the gate control signal, a rate of change of charge at the control terminal of the transistor is controlled to increase in an approximately logarithmic manner. Correspondingly, a change in current flowing through the transistor also occurs approximately logarithmically. Thus, Vocm increases logarithmically, rather than in a sudden or step fashion. By limiting the rate of change, or slew rate, of Vocm, current flowing into an output capacitor, and therefore voltage transients occurring in an audio device coupled to the output capacitor, are reduced. Thus, PCN occurring in the audio device is reduced resulting from use of the capacitor to filter the gate control signal of the transistor which sources current to provide Vocm.

At operation 408, an analog signal representative of the input signal is provided at the output capacitor. In some examples, the analog signal is formed based on control of a differential output stage according to the gate control signal. In an example, the analog signal may be convertible by the audio device to sound waves representative of the input signal.

Figure 5:
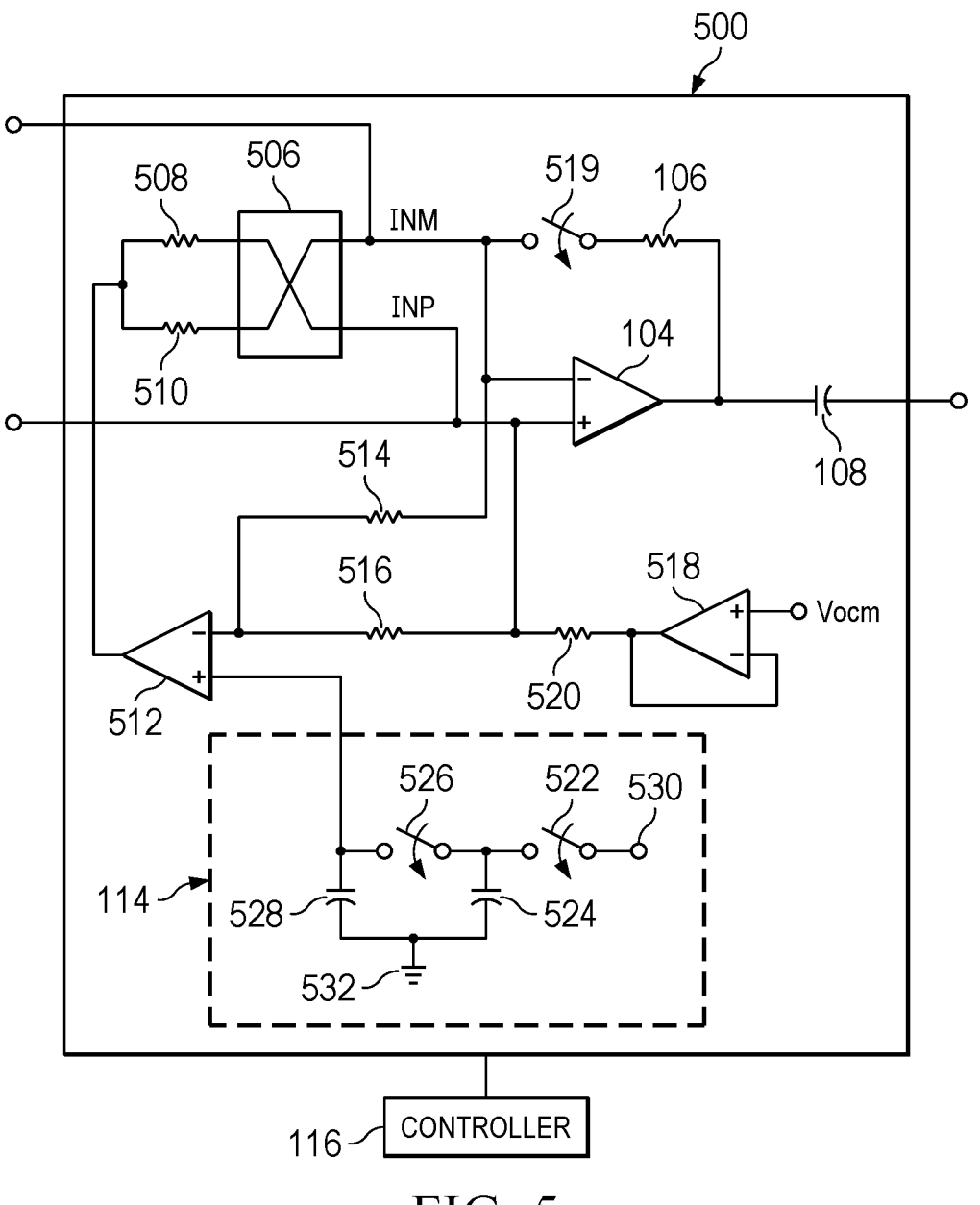
FIG. 5 is a schematic diagram of an example audio driver.

FIG. 5 is a schematic diagram of an example audio driver 500. In some examples, the audio driver 500 is suitable for implementation as the audio system 100 of FIG. 1. In some examples, the audio driver 500 includes the audio driver 104, the resistor 106, a chopping circuit 506, a resistor 508, a resistor 510, an amplifier 512, a resistor 514, a resistor 516, an amplifier 518, a resistor 520, and the ripple limiting circuit 114. While shown separately from the audio driver 104 in FIG. 5, in various examples at least some of the components or circuits shown external to the audio driver 104 may instead be implemented within, or as a part of, the audio driver 104, on a same substrate or semiconductor die as the audio driver 104, or the like. In some examples, the audio driver 104 may have an architecture as described above with respect to FIG. 2. For example, the audio driver 104 as shown in FIG. 5 may include the slew limiting circuit 112, as described above, and the description of which is not included again with respect to FIG. 5. In other examples, the audio driver 104 may have any other suitable architecture and feature set, such as omitting the slew limiting circuit 112, the scope of which is not limited herein. In some examples, the ripple limiting circuit 114 includes a switch 522, a capacitor 524, a switch 526, and a capacitor 528.

In an example, the audio driver 104 has first and second input terminals, and an output terminal, as described above. The resistor 106 has a first terminal coupled to the output terminal of the audio driver 104, and has a second terminal coupled to the first input terminal of the audio driver 104. The chopping circuit 506, which may have any suitable architecture for performing signal chopping, such as via two or more switches (not shown), has first and second input terminals, and first and second output terminals. In some examples, the chopping circuit 506 has one or more control terminals (not shown) coupled to the controller 116 to receive control signals from the controller 116. The first output terminal of the chopping circuit 506 is coupled to the first input terminal of the audio driver 104, and the second output terminal of the chopping circuit 506 is coupled to the second input terminal of the audio driver 104. The resistor 508 has first and second terminals, the second terminal of the resistor 508 coupled to the first input terminal of the chopping circuit 506. The resistor 510 has first and second terminals, the second terminal of the resistor 510 coupled to the second input terminal of the chopping circuit 506. The amplifier 512 has first and second input terminals, and has an output terminal. The output terminal of the amplifier 512 is coupled to the first terminal of the resistor 508 and to the first terminal of the resistor 510. The resistor 514 has first and second terminals, the first terminal coupled to the first input terminal of the amplifier 512, and the second terminal coupled to the first input terminal of the audio driver 104. The resistor 516 has first and second terminals, the first terminal coupled to the first input terminal of the amplifier 512, and the second terminal coupled to the second input terminal of the audio driver 104. The amplifier 518 has first and second input terminals, and has an output terminal. The first input terminal of the amplifier 518 is coupled to the output terminal of the audio driver 104, and the second input terminal of the amplifier 518 is coupled to the output terminal of the amplifier 518. The resistor 520 has first and second terminals, the first terminal of the resistor 520 coupled to the second input terminal of the audio driver 104, and the second terminal of the resistor 520 coupled to the output terminal of the amplifier 518. In an example, the DAC 102 is a differential DAC such that a first differential output terminal of the DAC 102 is coupled to the first input terminal of the audio driver 104 and a second differential output terminal of the DAC 102 is coupled to the second input terminal of the audio driver 104.

The switch 522 has first and second terminals, the first terminal of the switch 522 coupled to a reference signal terminal 530. The capacitor 524 has first and second terminals, the first terminal of the capacitor 524 coupled to the second terminal of the switch 522, and the second terminal of the capacitor 524 coupled to a ground terminal 532. The switch 526 has first and second terminals, the first terminal of the switch 526 coupled to the second input terminal of the amplifier 512, and the second terminal of the switch 526 coupled to the first terminal of the capacitor 524. The capacitor 528 has first and second terminals, the first terminal of the capacitor 528 coupled to the second input terminal of the amplifier 512, and the second terminal of the capacitor 528 coupled to the ground terminal 532.

In an example of operation of the audio driver 500, responsive to detecting (such as by the controller 116, or any other suitable component(s)) that an audio device 110 has been coupled to the capacitor 108, a reference signal having a first value is provided at the first input terminal of the amplifier 518 and, at a first time, at the terminal 530. In some examples, the reference signal is provided by the controller 116. In other examples, the reference signal is provided by any suitable voltage or signal source (not shown), the scope of which is not limited herein. In some examples, also responsive to detecting that the audio device 110 has been coupled to the capacitor 108, the capacitor 108 is charged to a value of the reference signal. The capacitor 108 may be charged to Vocm in any suitable manner, including at least via implementation of the slew limiting circuit 112, as described above herein.

At a subsequently occurring second time, the reference signal is provided at the reference signal terminal 530 having a second value. The reference signal may again be provided by the controller 116, or by any other suitable voltage or signal source, the scope of which is not limited herein. In some examples, the first value is approximately equal to Vocm. In some examples, the second value is approximately equal to Vicm, which may be a common mode voltage between the first and second input terminals of the audio driver 104. In at least some examples, Vicm is less than Vocm. The reference signal may be filtered by the ripple limiting circuit 114, such as via a switched capacitor RC filter formed by the capacitors 524, 528 and switches 522, 526 to form a filtered reference signal provided at the second input terminal of the amplifier 512. The switched capacitor RC filter may operate in a substantially similar manner to the RC filter formed by the capacitors 222, 228 and switches 220, 224 of the slew limiting circuit 112, as described above, but lacking the Miller Multiplication effect of the capacitor 228. As such, description of the filtering action of the switched capacitor RC filter is not repeated with respect to FIG. 5. In an example, the switches 522, 526 may be implemented in any suitable manner, the scope of which is not limited herein. In some examples, the switches 522, 526 are implemented as transistors. As such, the switches 522, 526 may each have a respective control terminal at which a signal is received, the value of which in relation to a value of a signal at another terminal of the switch determines whether the switch is conductive (e.g., substantially closed or on) or non-conductive (e.g., substantially open or off). In some examples, at least some of the switches 522, 526 receive the control signals from the controller 116. In other examples, at least some of the switches 522, 526 receive the control signals from any other suitable source, the scope of which is not limited herein.

Responsive to the filtered reference signal increasing in value to approximately equal Vocm, approximately no voltage difference exists across the resistors 508, 510, and therefore approximately no current flows through the resistors 508, 510. Thus, responsive to the filtered reference signal increasing in value to approximately equal Vocm, the controller 116 or another suitable control device, may control the chopping circuit 506 to begin chopping. Also responsive to the filtered reference signal increasing in value to approximately equal Vocm, the value of the reference signal provided at the reference signal terminal 530 may be transitioned from the first value to the second value. As a result, the filtered reference signal may decrease in value approximately logarithmically from about Vocm to about Vicm.

Because the filtered reference signal decreases in value at a rate approximating a logarithmic response, a difference between and increases at a corresponding approximately logarithmic rate. As a result, a voltage across the resistors 508, 510, and therefore an amount of current flowing through the resistors 508, 510 also increases at a corresponding approximately logarithmic rate. The chopping circuit 506 chopping signals received from the resistor 508, 510 may result in chopping artifacts (e.g., voltage ripple resulting from a mismatch between the two resistors 508, 510, or any other elements that are being chopped) that is reflected in an output signal of the amplifier 104 having magnitudes approximately proportional to the current flowing through the resistors 508, 510. Thus, by the ripple limiting circuit 114 controlling the voltage difference between Vocm and Vicm to occur in an approximately logarithmic manner, voltage ripple in Vout is correspondingly controlled to increase in an approximately logarithmic manner. By limiting the rate of increase of voltage ripple in Vout, a magnitude of PCN in the audio device 110 is decreased. Therefore, the ripple limiting circuit 114 of the audio driver 500 limits the occurrence of PCN in the audio device 110, increasing a user experience of a user driving the audio device 110 via the audio driver 500.

In an example, the amplifier 512 receives the filtered reference signal and a signal representing an average of signals provided at the first and second input terminals of the audio driver 104. The amplifier 512 provides an output signal representative of a difference between the filtered reference signal and average of the signals provided at the first and second input terminals of the audio driver 104. The output signal is provided to the resistors 508, 510, which provide the output signal to the chopping circuit 506. The chopping circuit 506 performs signal chopping according to any suitable process, the scope of which is not limited herein, to provide signals at the first and second input terminals of the audio driver 104, such as to cause the audio driver 104 to provide an output signal having a value of approximately Vocm for charging the capacitor 108, as described above herein. Subsequently, a differential input signal (e.g., formed by INM and INP) may be received, such as from the DAC 102, for driving an audio device 110 coupled to the capacitor 108 to cause the audio device 110 to produce sound waves based on the differential input signal.

Figure 6A:
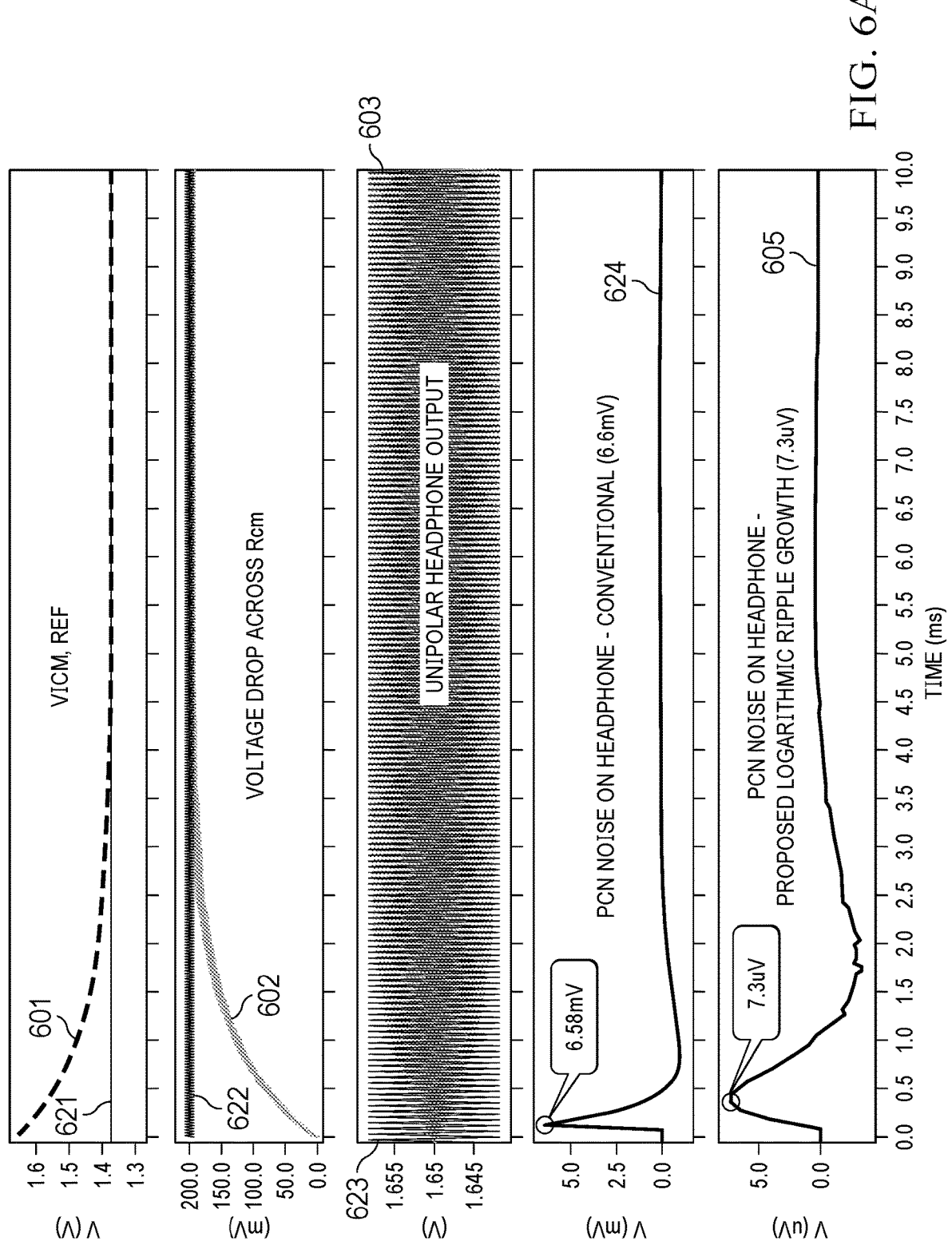
FIGS. 6A and 6B (which may collectively be referred to as FIG. 6) are diagrams of example signal waveforms.
Figure 6B:
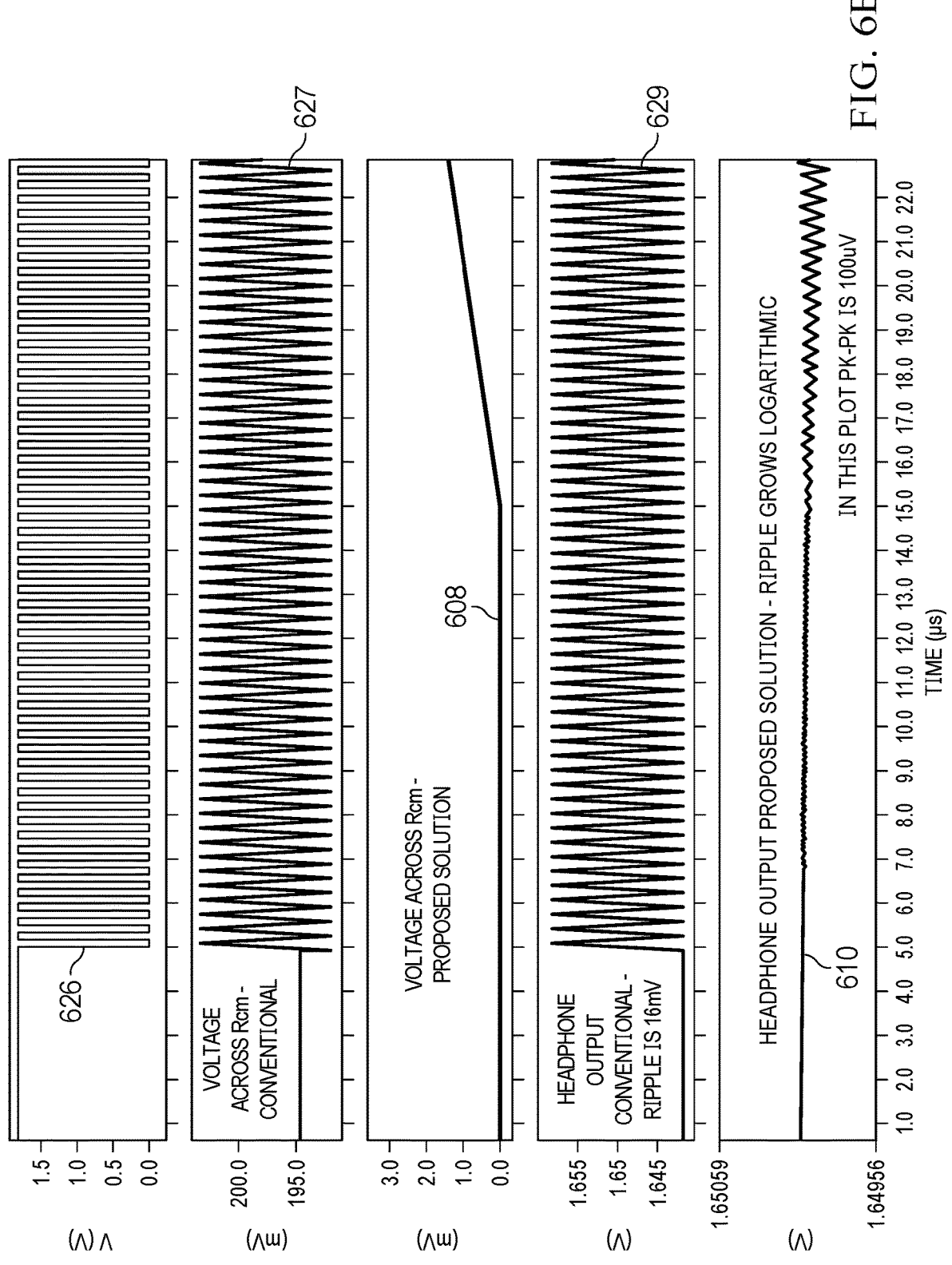

FIG. 6 is a diagram 600 of example signal waveforms. In an example, the diagram 600 is representative of at least some signals that may be present in the audio system 100, as described above with respect to FIG. 5. In an example, the diagram 600 includes signals 601, 602, 603, 605, 608, and 610. The signal 601 is representative of the filtered reference signal in the presence of the ripple limiting circuit 114, and is shown having a vertical axis representative of voltage in units of V and a horizontal axis representative of time in units of ms. The signal 602 is representative of a voltage drop across the resistors 508, 510 in the presence of the ripple limiting circuit 114, and is shown having a vertical axis representative of voltage in units of mV and the horizontal axis representative of time in ms. The signal 603 is representative of a signal provided at the second terminal of the capacitor 108 in the presence of the ripple limiting circuit 114, and is shown having a vertical axis representative of voltage in V and the horizontal axis representative of time in ms. The signal 605 is representative of a voltage of PCN in the signal 603 in the presence of the ripple limiting circuit 114, and is shown having a vertical axis representative of voltage in μV and the horizontal axis representative of time in ms. The signal 608 is representative of the signal 602 having a vertical axis representative of voltage in units of mV and a horizontal axis representative of time in microseconds (μs). The signal 610 is representative of the signal 603 shown having a vertical axis representative of voltage in units of mV and the horizontal axis representative of time in μs.

Similarly, the diagram 600 includes also signals 621, 622, 623, 624, 626, 627, and 629. The signal 621 is representative of the filtered reference signal in the absence of the ripple limiting circuit 114 (e.g., a substantially constant value approximately equal to Vicm), and is shown having a vertical axis representative of voltage in V and the horizontal axis representative of time in ms. The signal 622 is representative of the voltage drop across the resistors 508, 510 in the absence of the ripple limiting circuit 114, and is shown having a vertical axis representative of voltage in mV and the horizontal axis representative of time in ms. The signal 623 is representative of a signal provided at the second terminal of the capacitor 108 in the absence of the ripple limiting circuit 114, and is shown having a vertical axis representative of voltage in V and the horizontal axis representative of time in ms. The signal 624 is representative of a voltage of PCN in the signal 623 in the absence of the ripple limiting circuit 114, and is shown having a vertical axis representative of voltage in μV and the horizontal axis representative of time in ms. The signal 626 is representative of a chopping enable signal that controls operation of the chopping circuit 506 in the absence of the of the ripple limiting circuit 114, and is shown having a vertical axis representative of voltage in units of V and a horizontal axis representative of time in μs. The signal 627 is representative of the signal 622 having a vertical axis representative of voltage in units of mV and a horizontal axis representative of time in μs. The signal 629 is representative of the signal 623 shown having a vertical axis representative of voltage in units of mV and the horizontal axis representative of time in μs.

As shown by comparing the signals 601, 621, the ripple limiting circuit 114 causes the filtered reference signal to slowly decrease in value, approximately logarithmically, to approach Vicm (such as from Vocm), rather than maintaining an approximately constant value. This slow reduction in value of the filtered reference signal causes the voltage drop across the resistors 508, 510 to slowly, again approximately logarithmically, increase in value from about 0 rather than maintain an approximately constant value, as shown by the signals 602, 622 and 627, 608. As shown by comparing the signals 603, 623, this slow increase in voltage drop across the resistors 508, 510 causes an approximately logarithmic increase in value of the output signal of the audio system 100, as described elsewhere herein. A zoomed-in version of the signals 603, 623 showing a beginning of ripple growth is shown by the signals 608, 610. This logarithmic increase in value of the output signal of the audio system 100 results in reduced PCN, such as described above with respect to FIG. 5, and shown by the signals 624, 605.

FIG. 7 is a flowchart of an example method 700. In an example, the method 700 is implemented at least partially by the audio driver 500 and/or the controller 116. In an example, the method 700 is implemented to limit a slew rate of voltage ripple in Vout, provided by the audio driver 500. The method 700 may be implemented to limit the slew rate of the voltage ripple to mitigate the occurrence of PCN in an audio device, such as the audio device 110, coupled to the output capacitor and which receives a signal via the output capacitor for conversion from an analog voltage to audible sound waves.

At operation 702, a reference signal having a first value is received. The reference signal may be received, for example, responsive to coupling of an audio device to an audio driver or audio system. The reference signal may be received from any suitable source, the scope of which is not limited herein.

At operation 704, Vout is provided based on the reference signal, Vout including a common mode component Vocm. In some examples, Vout is provided by an audio driver, such as the audio driver 104, as described above herein with respect to FIG. 2, or any other suitable analog amplifier or driver.

At operation 706, a filtered reference signal is provided based on the reference signal. In some examples, the first value approximately equals Vocm. As a result, the filtered reference signal may have an approximately logarithmically increasing value beginning at approximately zero volts and increasing to approximately equal Vocm.

At operation 708, responsive to the filtered reference signal increasing in value to approximately equal Vocm, enable a chopping circuit. In some examples, the chopping circuit chops a signal representative of a difference between the filtered reference signal and an average of signals provided at the first and second input terminals of the audio driver 104. For example, the chopping circuit may be the chopping circuit 506, which may chop an output signal of the amplifier 502. The chopping circuit may be controlled to begin chopping in any suitable manner based on an architecture of the chopping circuit, and by any suitable device, such as the controller 116. In an example, at a time at which the chopping circuit is enabled, approximately no current may flow through the resistors 106, 508, 510, or 520 resulting from the filtered reference signal approximately equaling Vocm. As a result, an output signal of the amplifier 512 will have a value approximately equal to Vocm.

At operation 710, also responsive to the filtered reference signal increasing in value to approximately equal Vocm, the filtered reference signal is provided based on the reference signal having a second value. In some examples, the second value approximately equals Vicm. In this way, the reference signal may be considered to be a variable value reference signal, having the first value at a first time and having the second value at a second time As a result, the filtered reference signal may have an approximately logarithmically decreasing value beginning at approximately Vocm and decreasing to approximately equal Vicm. In this way, voltage drops across the resistors 106, 508, 510, 520 and therefore a current flowing through the resistors 106, 508, 510, 520 may be controlled to increase in an approximately logarithmic manner. This approximately logarithmic increase may cause voltage ripple occurring in Vout as a result of the chopping to increase from a magnitude of approximately zero volts in a logarithmic manner, limiting occurrence of PCN resulting from the voltage ripple. In at least some examples, the voltage ripple is limited to a peak-to-peak amplitude of about 100 μV.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a μser after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. Various switches are shown and described herein. Switches may be implemented as electromechanical devices, or as solid-state devices, based on an application environment of the switches. Although not necessarily explicitly shown or described herein, the switches may include control terminals at which a control signal is received to control a state of the switch, such as open or closed, nonconductive or conductive, off or on, or the like.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As μsed herein, the terms "terminal," "node," "interconnection," "pin," and "lead" are μsed interchangeably. Unless specifically stated to the contrary, these terms are generally μsed to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A circuit, comprising:
   a first transistor having a control terminal and first and second terminals,
   a first capacitor having first and second terminals, the first terminal of the first capacitor coupled to the control terminal of the first transistor and the second terminal of the first capacitor coupled to the second terminal of the first transistor;
   a first switch having first and second terminals, the second terminal of the first switch coupled to the control terminal of the first transistor; and
   a second capacitor having first and second terminals, the first terminal of the second capacitor coupled to the first terminal of the first transistor and the second terminal of the second capacitor coupled to the first terminal of the first switch.

2. The circuit of claim 1, further comprising:
a first resistor having first and second terminals, the first terminal of the first resistor coupled to the second terminal of the first transistor;
a second switch having first and second terminals, the first terminal of the second switch coupled to the second terminal of the first resistor; and
a third capacitor having first and second terminals, the first terminal of the third capacitor coupled to the second terminal of the second switch.

3. The circuit of claim 2, further comprising an audio producing device coupled between the second terminal of the third capacitor and a ground terminal.

4. The circuit of claim 2, further comprising:
an amplifier having an output terminal and first and second input terminals;
a third switch having first and second terminals, the first terminal of the third switch coupled to the output terminal of the amplifier and the second terminal of the second switch coupled to the first terminal of the first switch; and
a second resistor having first and second terminals, the first terminal of the second resistor coupled to the second terminal of the first capacitor and the second terminal of the second resistor coupled to a ground terminal.

5. The circuit of claim 4, further comprising:
a second transistor having a control terminal and first and second terminals, the first terminal of the second transistor coupled to the first terminal of the first transistor and the second terminal of the second transistor coupled to the second terminal of the second switch;
a fourth switch having first and second terminals, the first terminal of the fourth switch coupled to the output terminal of the amplifier, and the second terminal of the fourth switch coupled to the control terminal of the second transistor;
a third transistor having a control terminal and first and second terminals, the first terminal of the third transistor coupled to the second terminal of the second switch and the second terminal of the third transistor coupled to the ground terminal; and
a fifth switch having first and second terminals, the first terminal of the fifth switch coupled to the output terminal of the amplifier, and the second terminal of the fifth switch coupled to the control terminal of the third transistor.

6. The circuit of claim 5, further comprising:
a third resistor having first and second terminals, the second terminal of the third resistor coupled to the second terminal of the first capacitor;
a sixth switch having first and second terminals, the first terminal of the sixth switch coupled to the second input terminal of the amplifier and the second terminal of the sixth switch coupled to the first terminal of the third resistor;
a fourth resistor having first and second terminals, the second terminal of the fourth resistor coupled to the second terminal of the second switch; and
a seventh switch having first and second terminals, the first terminal of the seventh switch coupled to the second input terminal of the amplifier and the second terminal of the seventh switch coupled to the first terminal of the fourth resistor.

7. The circuit of claim 1, further comprising a voltage supply coupled to the first terminal of the first transistor.

8. A circuit, comprising:
a first amplifier having an output terminal and first and second input terminals;
a first capacitor having first and second terminals, the first terminal of the first capacitor coupled to the second input terminal of the first amplifier;
a first switch having first and second terminals, the first terminal of the first switch coupled to first terminal of the first capacitor; and
a second capacitor having first and second terminals, the first terminal of the second capacitor coupled to the second terminal of the first switch.

9. The circuit of claim 8, further comprising a second switch having first and second terminals, the first terminal of the second switch coupled to the second terminal of the first switch, wherein the second switch is configured to receive a variable value reference signal at the second terminal of the second switch.

10. The circuit of claim 8, further comprising:
a first resistor having first and second terminals, the first terminal of the first resistor coupled to the first input terminal of the first amplifier;
a second resistor having first and second terminals, the first terminal of the second resistor coupled to the first input terminal of the first amplifier; and
a second amplifier having an output terminal and first and second input terminals, the second terminal of the first resistor coupled to the first input terminal of the second amplifier and the second terminal of the second resistor coupled to the second input terminal of the second amplifier.

11. The circuit of claim 10, further comprising:
a third resistor having first and second terminals, the second terminal of the third resistor coupled to the output terminal of the second amplifier;
a third switch having first and second terminals, the first terminal of the third switch coupled to the first input terminal of the second amplifier, and the second terminal of the third switch coupled to the first terminal of the third resistor;
a fourth resistor having first and second terminals, the first terminal of the fourth resistor coupled to the second input terminal of the second amplifier; and
a third amplifier having an output terminal and first and second input terminals, the output terminal of the third amplifier coupled to the second terminal of the fourth resistor and to the second input terminal of the third amplifier.

12. The circuit of claim 10, further comprising:
a third resistor having first and second terminals, the first terminal of the third resistor coupled to the output terminal of the first amplifier;
a fourth resistor having first and second terminals, the first terminal of the fourth resistor coupled to the output terminal of the first amplifier; and
a chopping circuit having first and second input terminals and first and second output terminals, the first input terminal coupled to the second terminal of the third resistor, the first output terminal coupled to the first input terminal of the second amplifier, the second input terminal coupled to the second terminal of the fourth resistor, and the second output terminal coupled to the second input terminal of the second amplifier.

13. The circuit of claim 12, further comprising a third capacitor having first and second terminals, the first terminal of the third capacitor coupled to the output terminal of the second amplifier.

14. A system, comprising:

a first amplifier having an output terminal and having first and second input terminals, the first amplifier comprising:

a first transistor having a control terminal and first and second terminals;

a first capacitor having first and second terminals, the first terminal of the first capacitor coupled to the control terminal of the first transistor and the second terminal of the first capacitor coupled to the second terminal of the first transistor;

a first switch having first and second terminals, the second terminal of the first switch coupled to the control terminal of the first transistor; and a second capacitor having first and second terminals, the first terminal of the second capacitor coupled to the first terminal of the first transistor and the second terminal of the second capacitor coupled to the first terminal of the first switch;

a second amplifier having an output terminal and first and second input terminals;

a third capacitor having first and second terminals, the first terminal of the third capacitor coupled to the second input terminal of the second amplifier;

a second switch having first and second terminals, the first terminal of the second switch coupled to first terminal of the third capacitor;

a fourth capacitor having first and second terminals, the first terminal of the fourth capacitor coupled to the second terminal of the second switch;

a first resistor having first and second terminals, the first terminal of the first resistor coupled to the first input terminal of the second amplifier, and the second terminal of the first resistor coupled to the first input terminal of the first amplifier; and a second resistor having first and second terminals, the first terminal of the second resistor coupled to the first input terminal of the second amplifier, and the second terminal of the second resistor coupled to the second input terminal of the first amplifier.

15. The system of claim 14, comprising: a third switch having first and second terminals, the first terminal of the third switch coupled to the second terminal of the second switch, wherein the third switch is configured to receive a variable value reference signal at the second terminal of the third switch.

16. The system of claim 14, comprising a controller coupled to the first switch and the second switch.

17. The system of claim 14, comprising:

a third resistor having first and second terminals, the first terminal of the third resistor coupled to the output terminal of the second amplifier;

a fourth resistor having first and second terminals, the first terminal of the fourth resistor coupled to the output terminal of the second amplifier; and a chopping circuit having first and second input terminals and first and second output terminals, the first input terminal coupled to the second terminal of the third resistor, the first output terminal coupled to the first input terminal of the first amplifier, the second input terminal coupled to the second terminal of the fourth resistor, and the second output terminal coupled to the second input terminal of the first amplifier.

18. The system of claim 14, comprising:

a third resistor having first and second terminals, the second terminal of the third resistor coupled to the output terminal of the first amplifier;

a third switch having first and second terminals, the first terminal of the third switch coupled to the first input terminal of the first amplifier, and the second terminal of the third switch coupled to the first terminal of the third resistor;

a fourth resistor having first and second terminals, the first terminal of the fourth resistor coupled to the second input terminal of the first amplifier; and a third amplifier having an output terminal and first and second input terminals, the output terminal of the third amplifier coupled to the second terminal of the fourth resistor and to the second input terminal of the third amplifier.

19. The system of claim 14, wherein the first amplifier comprises:

a third resistor having first and second terminals, the first terminal of the third resistor coupled to the second terminal of the first transistor;

a third switch having first and second terminals, the first terminal of the third switch coupled to the second terminal of the third resistor; and a fifth capacitor having first and second terminals, the first terminal of the fifth capacitor coupled to the second terminal of the third switch;

a third amplifier having an output terminal and first and second input terminals;

a fourth switch having first and second terminals, the first terminal of the fourth switch coupled to the output terminal of the third amplifier and the second terminal of the fourth switch coupled to the first terminal of the first switch;

a fourth resistor having first and second terminals, the first terminal of the fourth resistor coupled to the second terminal of the first capacitor and the second terminal of the fourth resistor coupled to a ground terminal;

a second transistor having a control terminal and first and second terminals, the first terminal of the second transistor coupled to the first terminal of the first transistor and the second terminal of the second transistor coupled to the second terminal of the third switch;

a fifth switch having first and second terminals, the first terminal of the fifth switch coupled to the output terminal of the third amplifier, and the second terminal of the fifth switch coupled to the control terminal of the second transistor;

a third transistor having a control terminal and first and second terminals, the first terminal of the third transistor coupled to the second terminal of the third switch and the second terminal of the third transistor coupled to the ground terminal; and a sixth switch having first and second terminals, the first terminal of the sixth switch coupled to the output terminal of the third amplifier, and the second terminal of the sixth switch coupled to the control terminal of the third transistor.

20. The system of claim 14, comprising a fifth capacitor having first and second terminals, the first terminal of the fifth capacitor coupled to the output terminal of the first amplifier.

* * * * *